United States Patent
Yoneda (10) Patent No.: US 9,064,851 B2
(45) Date of Patent: Jun. 23, 2015

(54) SEMICONDUCTOR DEVICE

(71) Applicant: DENSO CORPORATION, Kariya, Aichi-pref. (JP)

(72) Inventor: Shuji Yoneda, Chiryu (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/183,754

(22) Filed: Feb. 19, 2014

(65) Prior Publication Data

US 2014/0239489 A1 Aug. 28, 2014

(30) Foreign Application Priority Data

Feb. 27, 2013 (JP) .................................. 2013-37463

(51) Int. Cl.
*H01L 23/482* (2006.01)
*H01L 25/065* (2006.01)

(52) U.S. Cl.
CPC ..... *H01L 23/4822* (2013.01); *H01L 2924/0002* (2013.01); *H01L 25/0655* (2013.01)

(58) Field of Classification Search
CPC .......................... H01L 23/4822; H01L 25/0655
See application file for complete search history.

(56) References Cited

U.S. PATENT DOCUMENTS

| 5,211,568 | A | * | 5/1993 | Yamada et al. | 439/157 |
| 5,521,426 | A | * | 5/1996 | Russell | 257/666 |
| 5,920,116 | A | * | 7/1999 | Umehara et al. | 257/669 |
| 6,468,113 | B1 | * | 10/2002 | Murakami et al. | 439/752 |
| 7,196,402 | B2 | * | 3/2007 | Cherian | 257/666 |
| 8,558,375 | B2 | * | 10/2013 | Mamitsu et al. | 257/714 |
| 2003/0075796 | A1 | | 4/2003 | Hata et al. | |
| 2012/0001227 | A1 | | 1/2012 | Takahashi et al. | |
| 2012/0098138 | A1 | | 4/2012 | Oka et al. | |

FOREIGN PATENT DOCUMENTS

| JP | 58-138351 U | 9/1983 |
| JP | 58-189546 U | 12/1983 |
| JP | S63-12850 U | 1/1988 |
| JP | S64-37020 U | 3/1989 |
| JP | 04-196573 A | 7/1992 |
| JP | 05-028052 U | 4/1993 |
| JP | H05-109967 A | 4/1993 |
| JP | H06-260582 A | 9/1994 |
| JP | 2009-283478 A | 12/2009 |

OTHER PUBLICATIONS

Office Action mailed Mar. 10, 2015 in the corresponding JP application No. 2013-037463 (with English translation).

* cited by examiner

*Primary Examiner* — William Coleman
(74) *Attorney, Agent, or Firm* — Posz Law Group, PLC (57) ABSTRACT

A semiconductor device includes a semiconductor chip, multiple terminals arranged in a first direction, a resin portion sealing the semiconductor chip and the terminals. The terminals are projected from a side surface of the resin portion in a second direction, and include at least one subject terminal having a first portion and a second portion. In the subject terminal, a first longitudinal end of the first portion is positioned inside of the resin portion and a second longitudinal end of the first portion is positioned outside of the resin portion, and the second portion is arranged adjacent to the first portion. Further, a length of the first portion is greater than a length of the second portion in the third direction, and a length of the first portion is smaller than a length of the second portion in the first direction.

10 Claims, 7 Drawing Sheets

SEMICONDUCTOR DEVICE

CROSS REFERENCE TO RELATED APPLICATION

This application is based on Japanese Patent Application No. 2013-037463 filed on Feb. 27, 2013, the disclosure of which is incorporated herein by reference.

TECHNICAL FIELD

The present disclosure relates to a semiconductor device including a semiconductor chip, terminals, and a resin portion that seals the semiconductor chip and the terminals.

BACKGROUND

As disclosed in JP 2012-005301 A (corresponding to US 2012/0001227 A1), a semiconductor device includes a semiconductor chip, terminals, and a resin portion that seals the semiconductor chip and the terminals. The terminals are projected from a surface of the resin portion toward outside, and are arranged in one direction.

In JP 2012-005301 A, the terminals of a main circuit of the semiconductor chip, which are also referred to as main terminals, are arranged on a terminal board in one direction. The terminal board has a recessed portion between two adjacent main terminals. Further, multiple control terminals are arranged on a different terminal board in one direction, and the terminal board has insulating partition walls, which have rib shapes and divide the control terminals into multiple groups.

In the above semiconductor device, the terminal boards are made of a resin material, and the recessed portions and the partition walls of the terminal boards secure a distance between two adjacent terminals. The distance needs to be secured between two adjacent terminals along a surface is also referred to as a creeping distance.

In the structure disclosed in JP 2012-005301, in order to reduce a size of the semiconductor device in the directions along which the terminals are arranged, a width of each recessed portion and a width of each partition wall need to be reduced. However, a size of each of the terminal boards, which are made of resin material and have the recessed portions and the partition walls, is difficult to be sufficiently reduced considering a strength, a withstand voltage, and a processing accuracy of the resin-made terminal board.

SUMMARY

In view of the foregoing difficulties, it is an object of the present disclosure to provide a semiconductor device which is reduced in size along an arranging direction of terminals while securing an electric conducting capability of the terminals.

According to an aspect of the present disclosure, a semiconductor device includes a semiconductor chip, a plurality of terminals electrically connected with the semiconductor chip, and a resin portion sealing the semiconductor chip and partially sealing each of the terminals. The terminals are arranged in a first direction, and are projected from a side surface of the resin portion and extending outward from the side surface. A longitudinal direction of each of the terminals is referred to as a second direction, and a direction perpendicular to the first direction and the second direction is referred to as a third direction. The terminals include at least one subject terminal that has a first portion and a second portion. In the subject terminal, a first longitudinal end of the first portion is positioned inside of the resin portion and a second longitudinal end of the first portion is positioned outside of the resin portion, and the second portion is arranged adjacent to the first portion in the second direction. In the subject terminal, a length of the first portion is greater than a length of the second portion in the third direction and a length of the first portion is smaller than a length of the second portion in the first direction.

With the above device, a body size of the semiconductor device along an arranging direction of the terminals is reduced while securing an electric conducting capability of the terminals.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
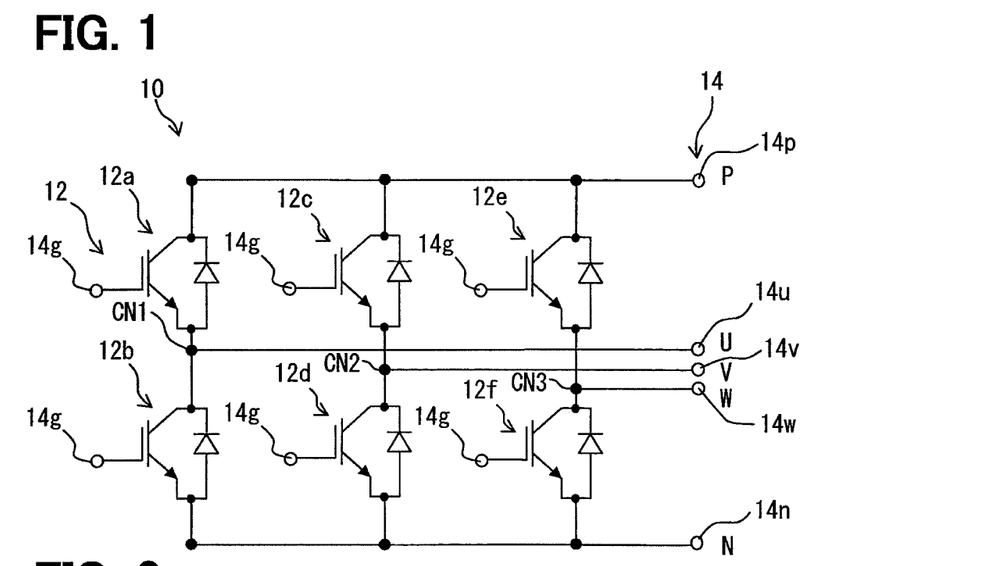
FIG. 1 is a circuit diagram showing an equivalent circuit of a semiconductor device according to an embodiment of the present disclosure.

The following will describe a semiconductor device 10 according to embodiments of the present disclosure with reference to accompanying drawings. As shown in FIG. 1, the semiconductor device 10 includes a pulse width modulation (PWM) inverter circuit. In the present embodiment, the inverter circuit is provided by a three-phase inverter as one example. Specifically, the semiconductor device 10 includes a semiconductor chip group 12 having six semiconductor chips 12a to 12f and terminals 14 corresponding to the semiconductor chips 12a to 12f. That is, the semiconductor device 10 has a 6 in 1 package. In the semiconductor device 10, an axis along which the terminals 14 projected from the same side surface of the semiconductor device are arranged is defined as an X axis, a longitudinal axis of each terminal 14 that is perpendicular to the X axis is defined as Y axis, and an axis perpendicular to the X axis and the Y axis is defined as Z axis. A direction along the X axis is also referred to as a first direction, a direction along the Y axis is also referred to as a second direction, and a direction along the Z axis is also referred to as a third direction. Hereinafter, a planar shape is a shape on a X-Y plane defined by the X axis and the Y axis.

The semiconductor chip 12a includes an n-channel insulated gate bipolar transistor (IGBT) and a free wheeling diode (FWD) that is connected with the IGBT in reverse parallel. The semiconductor chip 12b includes an n-channel IGBT and a FWD connected with the IGBT in reverse parallel.

In the semiconductor chip 12a, a collector electrode of the IGBT is connected with a cathode electrode of the FWD and a high power terminal 14p. Hereinafter, the high power terminal 14p is also referred to as a P terminal (P) 14p. In the semiconductor chip 12b, an emitter electrode of the IGBT is connected with an anode electrode of the FWD and a low power terminal 14n having a potential lower than a potential of the high power terminal 14p. Hereinafter, the low power terminal 14n is also referred to as an N terminal (N) 14n.

Further, an emitter electrode of the IGBT of the semiconductor chip 12a and an anode electrode of the FWD of the semiconductor chip 12a are connected with a collector electrode of the IGBT of the semiconductor chip 12b and a cathode electrode of the FWD of the semiconductor chip 12b at a connection point CN1. Further, a U-phase output terminal 14u of the three-phase inverter is connected to the connection point CN1. The semiconductor chip 12a and the semiconductor chip 12b, respectively, configure an upper arm circuit and a lower arm circuit of a U-phase circuit.

The semiconductor chip 12c includes an n-channel IGBT and a FWD connected with the IGBT in reverse parallel, and the semiconductor chip 12d includes an n-channel IGBT and a FWD connected with the IGBT in reverse parallel. In the semiconductor chip 12c, a collector electrode of the IGBT is connected with a cathode electrode of the FWD and the P terminal 14p. In the semiconductor chip 12d, an emitter electrode of the IGBT is connected with an anode electrode of the FWD and the N terminal 14n.

Further, an emitter electrode of the IGBT of the semiconductor chip 12c and an anode electrode of the FWD of the semiconductor chip 12c are connected with a collector electrode of the IGBT of the semiconductor chip 12d and a cathode electrode of the FWD of the semiconductor chip 12d at a connection point CN2. Further, a V-phase output terminal 14v of the three-phase inverter is connected to the connection point CN2. The semiconductor chip 12c and the semiconductor chip 12d, respectively, configure an upper arm circuit and a lower arm circuit of a V-phase circuit.

The semiconductor chip 12e includes an n-channel IGBT and a FWD connected with the IGBT in reverse parallel, and the semiconductor chip 12f includes an n-channel IGBT and a FWD connected with the IGBT in reverse parallel. In the semiconductor chip 12e, a collector electrode of the IGBT is connected with a cathode electrode of the FWD and the P terminal 14p. In the semiconductor chip 12f, an emitter electrode of the IGBT is connected with an anode electrode of the FWD and the N terminal 14n.

Further, an emitter electrode of the IGBT of the semiconductor chip 12e and an anode electrode of the FWD of the semiconductor chip 12e are connected with a collector electrode of the IGBT of the semiconductor chip 12f and a cathode electrode of the FWD of the semiconductor chip 12f at a connection point CN3. Further, a W-phase output terminal 14w of the three-phase inverter is connected to the connection point CN3. The semiconductor chip 12e and the semiconductor chip 12f, respectively, configure an upper arm circuit and a lower arm circuit of a W-phase circuit.

A gate electrode of each of the semiconductor chips 12a to 12f is connected with a gate terminal 14g.

Figure 2:
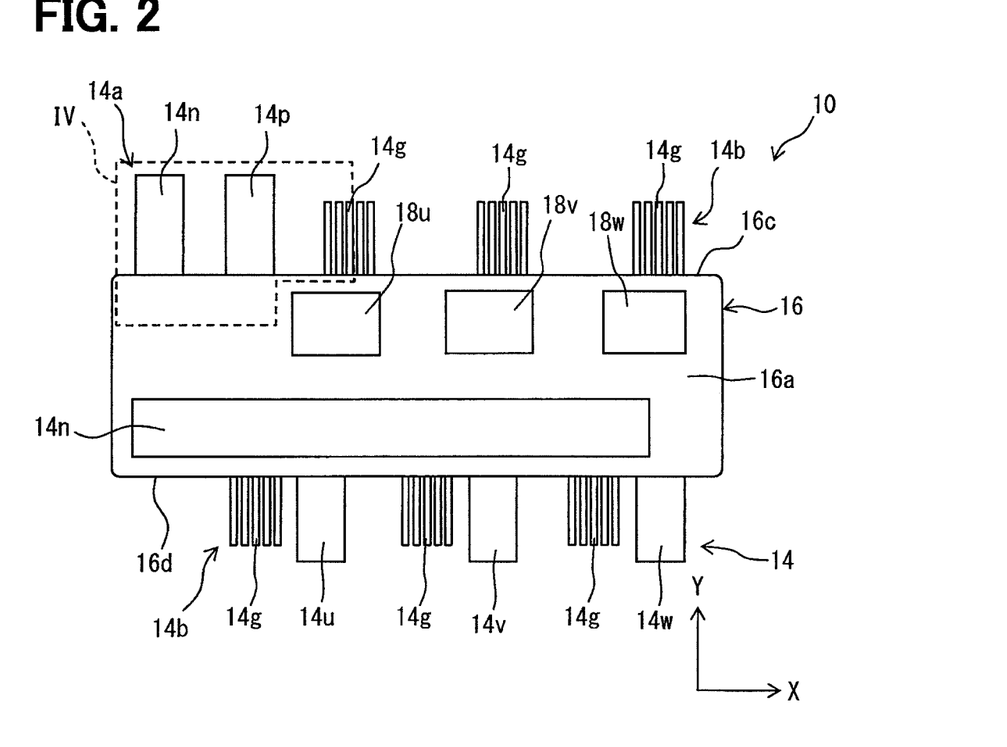
FIG. 2 is a diagram showing a plan view of a configuration of the semiconductor device.
Figure 3:
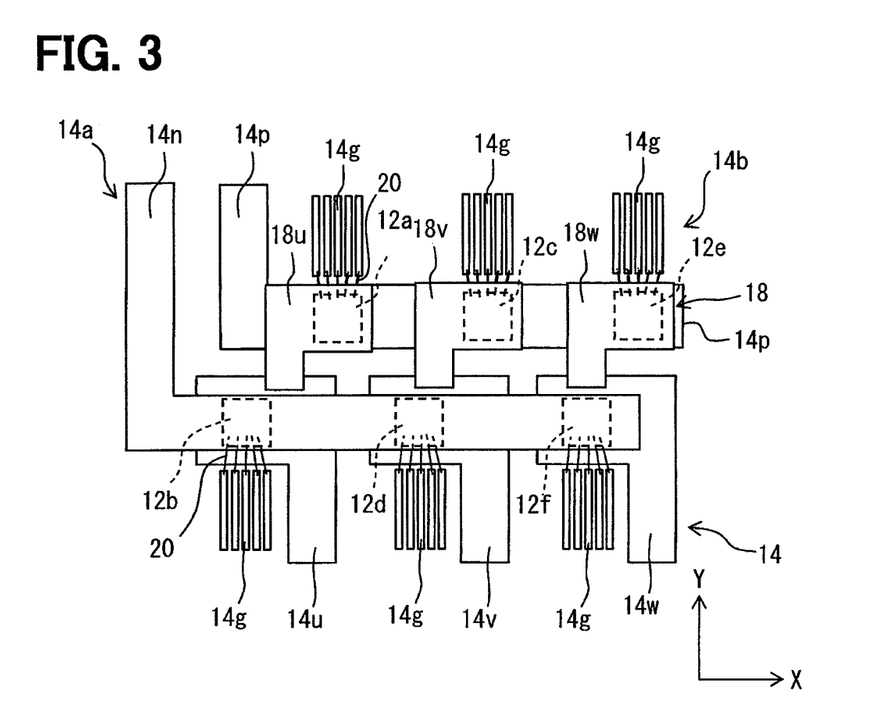
FIG. 3 is a diagram showing a plan view of terminals and semiconductor chips of the semiconductor device.

The following will describe a general configuration of the semiconductor device 10 with reference to FIG. 2 and FIG. 3.

The semiconductor device 10 includes the semiconductor chip group 12, which has the semiconductor chips 12a to 12f, multiple terminals 14, and a resin portion 16. The multiple terminals 14 include multiple main terminals 14a and multiple control terminals 14b.

The main terminals 14a include the power terminals including the P terminal 14p and the N terminal 14n, and three output terminals of the three-phase inverter. The three output terminals include the U-phase output terminal 14u, the V-phase output terminal 14v, and the W-phase output terminal 14w. The control terminals 14b include at least the gate terminals 14g.

As shown in FIG. 3, the collector electrodes and the cathode electrodes of the semiconductor chips 12a, 12c, 12e, each of which configures the upper arm circuit of each phase circuit, are arranged opposed to one surface of the P terminal 14p. The collector electrodes and the cathode electrodes of the semiconductor chips 12a, 12c, 12e, which are arranged opposed to one surface of the P terminal 14p, are electrically and mechanically connected with the surface of the P terminal 14p by solder portions (not shown).

Further, the emitter electrodes and the anode electrodes of the semiconductor chips 12a, 12c, 12e are electrically and mechanically connected with relay terminals 18u, 18v, 18w via solder portions (not shown) and metal plates (not shown). Specifically, in each of the semiconductor chips 12a, 12c, 12e, the emitter electrode and the anode electrode of the semiconductor chip 12a, 12c, 12e are electrically and mechanically connected with a corresponding metal plate via a first solder portion, and a corresponding relay terminal 18u, 18v, 18w is electrically and mechanically connected with the corresponding metal plate via a second solder portion. With this configuration, the emitter electrode and the anode electrode of each of the semiconductor chips 12a, 12c, 12e are electrically and mechanically connected with corresponding relay terminal 18u, 18v, 18w. The metal plate is a well-known component, which is used for securing a height required in connecting bonding wires with the control terminals 14b.

The relay terminal 18u, which is also referred to as a U-phase relay terminal 18u, is electrically connected with the emitter electrode and the anode electrode of the semiconductor chip 12a, and is also electrically and mechanically connected with the U-phase output terminal 14u via a solder portion (not shown). That is, the U-phase relay terminal 18u electrically connects the semiconductor chip 12a with the U-phase output terminal 14u. The relay terminal 18v, which is also referred to as a V-phase relay terminal 18v, is electrically connected with the emitter electrode and the anode electrode of the semiconductor chip 12c, and is also electrically and mechanically connected with the V-phase output terminal 14v via a solder portion (not shown). That is, the V-phase relay terminal 18v electrically connects the semiconductor chip 12c with the V-phase output terminal 14v. The relay terminal 18w, which is also referred to as a W-phase relay terminal 18w, is electrically connected with the emitter electrode and the anode electrode of the semiconductor chip 12e, and is also electrically and mechanically connected with the W-phase output terminal 14w via a solder portion (not shown). That is, the W-phase relay terminal 18w electrically connects the semiconductor chip 12e with the W-phase output terminal 14w.

As shown in FIG. 3, the collector electrode and the cathode electrode of the semiconductor chip 12b, which configure the lower arm circuit of the U-phase, are arranged opposed to one surface of the U-phase output terminal 14u. The collector electrode and the cathode electrode of the semiconductor chip 12b, which are arranged opposed to the one surface of the U-phase output terminal 14u, are electrically and mechanically connected with the U-phase output terminal 14u by solder portions (not shown). The collector electrode and the cathode electrode of the semiconductor chip 12d, which configure the lower arm circuit of the V-phase, are arranged opposed to one surface of the V-phase output terminal 14v. The collector electrode and the cathode electrode of the semiconductor chip 12d, which are arranged opposed to the one surface of the V-phase output terminal 14v, are electrically and mechanically connected with the V-phase output terminal 14v by solder portions (not shown). The collector electrode and the cathode electrode of the semiconductor chip 12f, which configure the lower arm circuit of the W-phase, are arranged opposed to one surface of the W-phase output terminal 14w. The collector electrode and the cathode electrode of the semiconductor chip 121, which are arranged opposed to the one surface of the W-phase output terminal 14w, are electrically and mechanically connected with the W-phase output terminal 14w by solder portions (not shown).

Further, the emitter electrode and the anode electrode of each of the semiconductor chips 12b, 12d, 12f, which configure the lower arm circuit of each phase U, V, W, are electrically and mechanically connected with the N terminal 14n via solder portions and metal plates (not shown). Specifically, in each of the semiconductor chips 12b, 12d, 12f, the emitter electrode and the anode electrode of the semiconductor chip 12b, 12d, , 12f are electrically and mechanically connected with a corresponding metal plate via a first solder portion, and the N terminal 14n is electrically and mechanically connected with the corresponding metal plate via a second solder portion. With this configuration, the emitter electrode and the anode electrode of each of the semiconductor chips 12b, 12d, 12f are electrically and mechanically connected with N terminal 14n. The metal plate arranged between the emitter electrode or the anode electrode of each semiconductor chip 12b, 12d, 12f and the N terminal 14n is similar to the metal plate arranged between the emitter electrode or the anode electrode of each semiconductor chip 12b, 12d, 12e and the corresponding relay terminal 18u, 18v, 18w.

Figure 4:
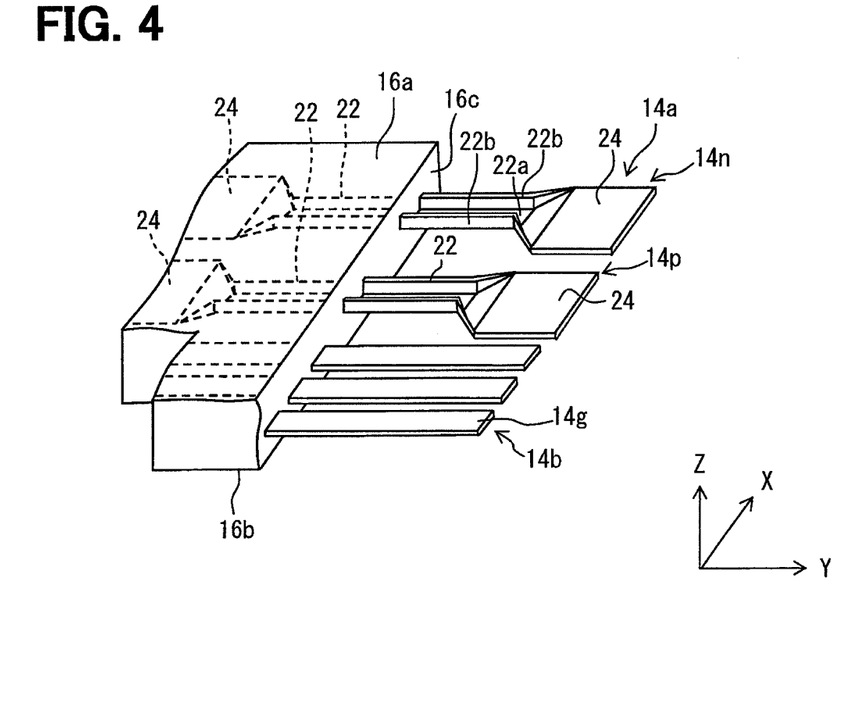
FIG. 4 is a diagram showing a perspective enlarged view of a part of a semiconductor device shown by a dashed line IV in FIG. 2 according to a first embodiment of the present disclosure.

As shown in FIG. 4, the resin portion 16 includes a first surface 16a, a second surface 16b opposite to the first surface 16a, a first side surface 16c arranged between the first surface and the second surface, and a second side surface 16d opposite to the first side surface 16c and arranged between the first surface and the second surface. Thus, a direction pointing from the second surface 16b toward the first surface 16a is parallel to the Z axis. Thus, in a portion of the semiconductor device 10 configuring the upper arm circuit of each phase, the P terminal 14p, each semiconductor chip 12a, 12c, 12e, the metal plate (not shown), and the relay terminal 18 are arranged in order along the Z axis. Further, in a portion of the semiconductor device 10 configuring the lower arm circuit of each phase, each output terminal 14u, 14v, 14w, each semiconductor chip 12b, 12d, 12f, the metal plate (not shown), and the N terminal 14n are arranged in order along the Z axis. That is, an arranging order of the components in the portion configuring the upper arm circuit is similar to an arranging order of the components in the portion configuring the lower arm circuit.

In the present embodiment, as shown in FIG. 2 and FIG. 3, five control terminals 14b are arranged corresponding to each semiconductor chip 12a to 12f. The five control terminals 14b include one gate terminal 14g, two terminals of a temperature measuring diode, one current sensing terminal, and one emitter sensing terminal. The control terminals 14b of each semiconductor chip 12a to 12f are electrically connected with a pad of a corresponding semiconductor chip 12a to 12f via bonding wires 20. The pad of each semiconductor chip 12a to 12f includes the gate electrode of the IGBT.

The resin portion 16 integrally seals the semiconductor chips 12a to 12f, the bonding wires 20, a part of the P terminal 14p, a part of the N terminal 14n, a part of each output terminal 14u, 14v, 14w, a part of each control terminal 14b, a part of relay terminal 18u, 18v, 18w.

As shown in FIG. 2, in the present embodiment, the first surface 16a has a plan rectangular shape on the X-Y plane. The N terminal 14n and the relay terminals 18u, 18v, 18w are partially exposed to outside from the first surface 16a of the resin portion 16. Specifically, the N terminal 14n and the relay terminals 18u, 18v, 18w are arranged on the same plane, and are partially exposed to outside. Further, the P terminal 14p and the output terminals 14u, 14v, 14w are partially exposed to outside from the second surface 16b of the resin portion. Specifically, the P terminal 14n and the output terminals 14u, 14v, 14w are arranged on the same plane, and are partially exposed to outside. In the present embodiment, each of the P terminal 14p, the N terminal 14n, the output terminals 14u, 14v, 14w, and the relay terminals 18u, 18v, 18w also functions as a heat sink. Thus, heat generated by each of the semiconductor chips 12a to 12f is released from the first surface 16a and the second surface 16b.

As shown in FIG. 2, the first side surface 16c and the second side surface 16d are approximately parallel to the X axis. Further, the P terminal 14p and the N terminal 14n are projected from the first side surface 16c of the resin portion 16. Further, control terminals 14b corresponding to each of the semiconductor chips 12a, 12c, 12e, which configure the upper arm circuit, are projected from the first side surface 16c of the resin portion 16. Specifically, as shown in FIG. 2, the P terminal 14p, the N terminal 14n, the control terminals 14b of the semiconductor chip 12a, the control terminals 14b of the semiconductor chip 12c, and the control terminals 14b of the semiconductor chip 12e are arranged in order along the X axis.

Further, the output terminals 14u, 14v, 14w of the main terminals 14a are projected from the second side surface 16d of the resin portion 16. Further, the control terminals 14b corresponding to each of the semiconductor chips 12b, 12d, 12f, which configure the lower arm circuit, are projected from the second side surface 16d of the resin portion 16. Specifically, as shown in FIG. 2, the control terminals 14b of the semiconductor chip 12b, the U-phase output terminal 14u, the control terminals 14b of the semiconductor chip 12d, the V-phase output terminal 14v, the control terminals 14b of the semiconductor chip 12f, and the W-phase output terminal 14w are arranged in order along the X axis.

The following will describe a configuration and an arrangement of the terminals 14 projected from the first side surface 16c and the second side surface 16d of the resin portion 16 of the semiconductor device 10.

Figure 5:
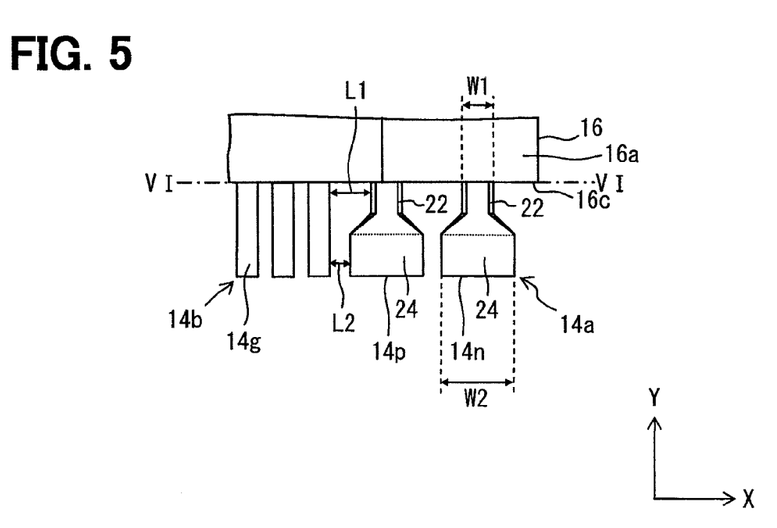
FIG. 5 is a diagram showing a plan view of the part of the semiconductor device shown by the dashed line IV in FIG. 2 according to the first embodiment of the present disclosure.
Figure 6:
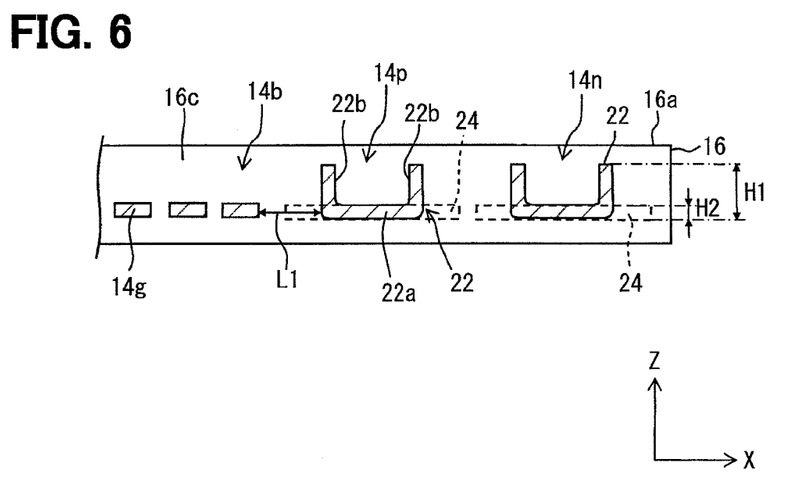
FIG. 6 is a diagram showing a cross-sectional view of the part of the semiconductor device in a line VI-VI in FIG. 5 according to the first embodiment of the present disclosure.

As shown in FIG. 4 to FIG. 6, at least one of the terminals 14 projected from the first side surface 16c has a first portion 22 and at least one second portion 24. In an example shown in FIG. 4 to FIG. 4, at least one of the terminals 14 projected from the first side surface 16c has a first portion 22 and two second portions 24. The first portion 22 is arranged between the two second portions 24. The first portion 22 is arranged along the Y axis, which is the longitudinal direction of the terminal 14. The first portion 22 extends from an inside portion of the resin portion 16 to an outside portion of the resin portion 16 in the Y axis. That is; a first longitudinal end of the first portion 22 is positioned inside of the resin portion 16, and a second longitudinal end of the first portion 22 is positioned outside of the resin portion 16. The second portion 24 is arranged adjacent to the first portion 22 along the Y axis. A length of the first portion 22 along the Z axis is greater than a length of the second portion 24 along the Z axis. The second portions 24 are arranged at different positions from the first portion 22 along the Y axis. Further, the first portion 22 has a length smaller than a length of the second portion 24 along the X axis. Hereinafter, a length along the X axis is also referred to as a width. Thus, a width of the first portion 22 is smaller than a width of the second portion 24.

In the present embodiment, among the main terminals 14a of the multiple terminals 14, each of the P terminal 14p and the N terminal 14n has the first portion 22 and two second portions 24. Each of the control terminals 14b has a plate shape, which has an approximately constant thickness along the Y axis. Herein, the thickness of the control terminal 14b is a length of the control terminal 14b along the Z axis.

Further, each of the P terminal 14p and the N terminal 14n is provided by a metal plate having a longitudinal direction parallel to the Y axis. Specifically, each of the P terminal 14p and the N terminal 14n is formed by bending the metal plate, which has an approximately constant cross-sectional area along the Y axis. Herein, the cross section of the metal plate providing each terminal 14 is perpendicular to the Y axis. Thus, a cross-sectional area of the first portion 22 along the Y axis is approximately equal to a cross-sectional area of the second portion 24 along the Y axis. Specifically, no processing is performed to a part of the metal plate, which provides the second portion 24. Thus, the second portion 24 has a plan shape on the X-Y plane. Further, a bending process is performed to the first portion 22, which is sandwiched between the two second portions 24. Specifically, in the metal plate providing the first portion 22, two lateral ends arranged along the X axis are bent toward the first surface 16a by approximately 90 degrees. That is, the two lateral ends of the metal plate, which provides the first portion 22, are bent in the Z axis. Thus, a cross section of the first portion 22 approximately has a U shape. The first portion 22 includes a bottom section 22a and a pair of walls 22b, each of which extends from a corresponding lateral end of the bottom section 22a along the Z axis. The walls 22b of the first portion 22 are provided by the lateral ends of the first portion 22, which are bent toward the first surface 16a of the resin portion 16. The walls of 22b of the first portion 22 are also referred to as a bent section 22b.

FIG. 6 shows a plan view of the first side surface 16c of the resin portion 16. As shown in FIG. 6, in each of the P terminal 14p and the N terminal 14n of the semiconductor device 10 according to the present embodiment, the bending process is performed to a part of the metal plate, which provides the first portion 22. The bending process is performed so that a length H1 of the first portion 22 along the Z axis is greater than a length H2 of the second portion 24 along the Z axis. In FIG. 6, cross sections of the second portions 24 are shown by dashed lines. Further, as shown in FIG. 5, the width W1 of the first portion 22 is smaller than the width W2 of the second portion 24. Herein, the width is a length along the X axis.

The output terminals 14u, 14v, 14w projected from the second side surface 16d of the resin portion 16 have similar structures to the P terminal 14p and the N terminal 14n projected from the first side surface 16c of the resin portion 16. Further, each of the control terminals 14b projected from the second side surface 16d of the resin portion 16 has a plate shape on the X-Y plane, and has an approximately constant length along the Z axis.

Further, a resin-made tie bar is arranged surrounding the side surfaces of the resin portion 16 so that the tie bar is equipped to the terminals 14, which are projected from the first side surface 16c and the second side surface 16d of the resin portion 16. As well known, the tie bar restricts resin leakage from a cavity during a forming of the resin portion 16.

The following will describe advantages provided by the semiconductor device 10 according to the present embodiment.

In the present embodiment, at least one of the terminals 14, which are projected from one side surface of the resin portion 16 has the first portion 22 and the second portion 24. Herein, the one side surface is the first side surface 16c or the second side surface 16d. The first portion 22 has the length greater than the length of the second portion 24 along the Z axis. Further, along the X axis, the first portion 22 has the width smaller than the width of the second portion 24. Thus, as shown in FIG. 5, the terminal 14, which has the first portion 22 and the second portion 24, can be arranged close to the adjacent terminal 14 while securing a creeping distance L1 between the two terminals. Further, the two terminals may be arranged close to each other while securing a spatial distance L2. Herein, the creeping distance and the spatial distance are distances needed for insulation. Thus, in the semiconductor device 10 according to the present embodiment, a body size of the semiconductor device 10 along the X axis is reduced while securing the creeping distance L1 compared with a structure in which none of the terminals 14 has the first portion 22. Further, in the present embodiment, since six semiconductor chips 12a to 12f are sealed by single resin portion 16, the semiconductor device 10 has large number of terminals 14 projected from the first side surface 16c and the second side surface 16d. With above-described structure, when two adjacent terminals have different potentials, the creeping distance between the two adjacent terminals is secured and the body size of the semiconductor device 10 is reduced.

In the present embodiment, the length H1 of the first portion 22 along the Z axis is greater than the length H2 of the second portion 24 along the Z axis, and the width W1 of the first portion 22 is smaller than the width W2 of the second portion 24 along the X axis. In a conventional structure of the semiconductor device, the creeping distance is secured by reducing a cross-sectional area of the terminal. However, in the present embodiment, the creeping distance L1 is secured by setting the length H1 of the first portion 22 different from the length H2 of the second portion 24 along the Z axis. Further, the cross-sectional area of the first portion 22 is set equal to the cross-sectional area of the second portion 24. Thus, the conducting capability of the terminal 14 is maintained while securing the creeping distance L1. Accordingly, in the semiconductor device 10 according to the present embodiment, the body size of the semiconductor device 10 is reduced along the X axis while maintaining the conducting capability of the terminals 14. Particularly, in the present embodiment, since the cross-sectional area of the main terminal 14a is constant along the Y axis. Thus, the creeping distance L1 is secured without sacrificing the conducting capability of the terminals 14a. As described above, in the present embodiment, the length H1 of the first portion 22 along the Z axis is greater than the length H2 of the second portion 24 along the Z axis, and the width W1 of the first portion 22 is smaller than the width W2 of the second portion 24. Thus, the conducting capability of the terminal 14 is secured and the body size of the semiconductor device 10 is reduced along the X axis compared with a structure in which the creeping distance L1 is secured by reducing the cross-sectional area of the first portion 22 by setting, for example, the length H1 of the first portion 22 along the Z axis equal to or smaller than the length H2 of the second portion 24 along the Z axis and setting the width W1 of the first portion 22 smaller than the width W2 of the second portion 24.

In the present embodiment, at least one of the main terminal 14a and an adjacent terminal, which is arranged adjacent to the main terminal 14a along the X axis, has the first portion 22 and the second portion 24. Hereinafter, the terminal 14 having the first portion 22 and the second portion 24 is also referred to as a subject terminal. Since a potential difference between the main terminal 14a and the adjacent terminal is great when the adjacent terminal is the control terminal 14b, the creeping distance L1 needs to be secured between the main terminal 14a and the adjacent terminal 14. That is, the body size of the semiconductor device 10 is reduced and the creeping distance L1 is secured by forming the first portion 22 and the second portion 24 in at least one of adjacent two terminals 14, which have great potential difference, compared with a structure in which the first portion 22 and the second portion 24 are formed in at least one of adjacent two terminals 14, which have small potential difference, such as two control terminals 14b. Further, the conducting capability is secured. In the present embodiment, at least one of the main terminals 14a has the first portion 22 and the second portion 24. Further, the main terminal 14a, through which a greater current flows compared with the control terminal 14b, has the cross-sectional area greater than the cross-sectional area of the control terminal 14b. Thus, when the first portion 22 and the second portion 24 are formed in the main terminal 14a, the body size of the semiconductor device 10 can be reduced much more compared with a case in which the first portion 22 and the second portion 24 are formed in the control terminal 14b. Further, in the present embodiment, the first portion 22 and the second portion 24 are formed in at least one of the main terminals 14a. Further, the first portion 22 and the second portion 24 may be formed in all of the main terminals 14a.

In the present embodiment, the first portion 22 and the second portion 24 of the main terminal 14a is formed by the bending process. Thus, a manufacturing cost of the first portion 22 and the second portion 24 can be reduced compared with forming the first portion 22 and the second portion 24 with a deformed material by rolling process. Specifically, the lateral ends of the metal plate to provide the first portion 22 are bent by the bending process. Thus, a bending angle in the bending process is easy to be managed.

Figure 7A:
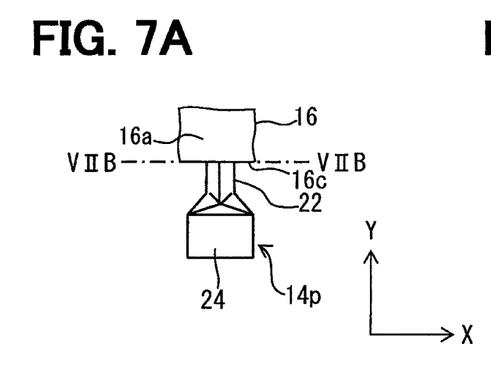
FIG. 7A is a diagram showing a plan view of a terminal of a semiconductor device according to a first modification of the present disclosure.
Figure 7B:
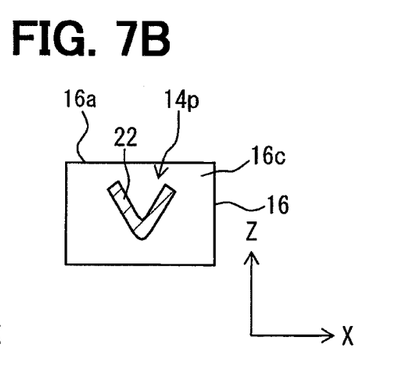
FIG. 7B is a diagram showing a cross-sectional view of the semiconductor device along a line VIIB-VIIB shown in FIG. 7A.
Figure 8A:
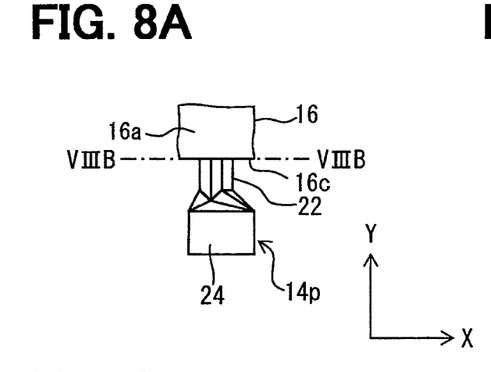
FIG. 8A is a diagram showing a plan view of a terminal of a semiconductor device according to a second modification of the present disclosure.
Figure 8B:
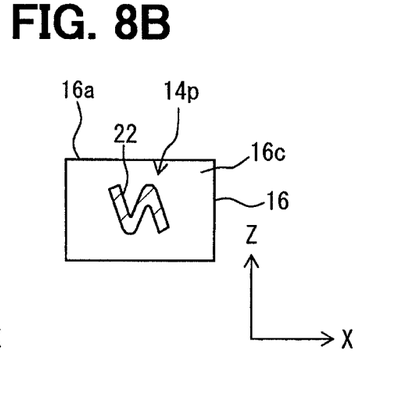
FIG. 8B is a diagram showing a cross-sectional view of the semiconductor device along a line VIIIB-VIIIB shown in FIG. 8A.

In the present embodiment, the cross section of the first portion 22 approximately has the U-shape. Further, the cross section of the first portion 22 may have a shape other than the U-shape. FIG. 7A and FIG. 7B show a first modification of the semiconductor device 10 in which the cross section of the first portion 22 has a V-shape. FIG. 8A and FIG. 8B show a second modification of the semiconductor device 10 in which the cross section of the first portion 22 has an N-shape. In the first modification and the second modification of the semiconductor device 10 shown in FIG. 7A to FIG. 8B, the P terminal 14p is illustrated as an example.

Second Embodiment

The following will describe a semiconductor device 10 according to a second embodiment of the present disclosure. In the following description, description of the same or equivalent parts with the first embodiment will be omitted.

Figure 9:
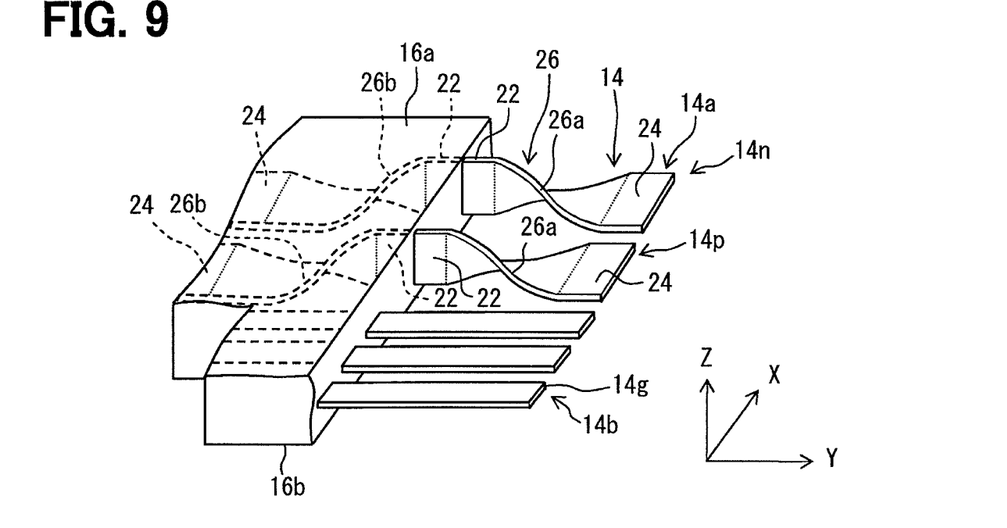
FIG. 9 is a diagram showing a perspective enlarged view of the part of the semiconductor device shown by the dashed line IV in FIG. 2 according to a second embodiment of the present disclosure.

In the present embodiment, the terminal 14, which has the first portion 22 and the second portion 24, further has a twist portion 26 as shown in FIG. 9. The twist portion 26 is connected with the first portion 22 and the second portion 24. In the present embodiment, the first portion is provided by a metal plate having a thickness. In the first portion 22, a direction along the thickness of the metal plate is perpendicular to the Y axis, and is parallel to or angled with the X axis. Other parts of the semiconductor device 10 according to the present embodiment are similar to the semiconductor device 10 according to the first embodiment.

Figure 10:
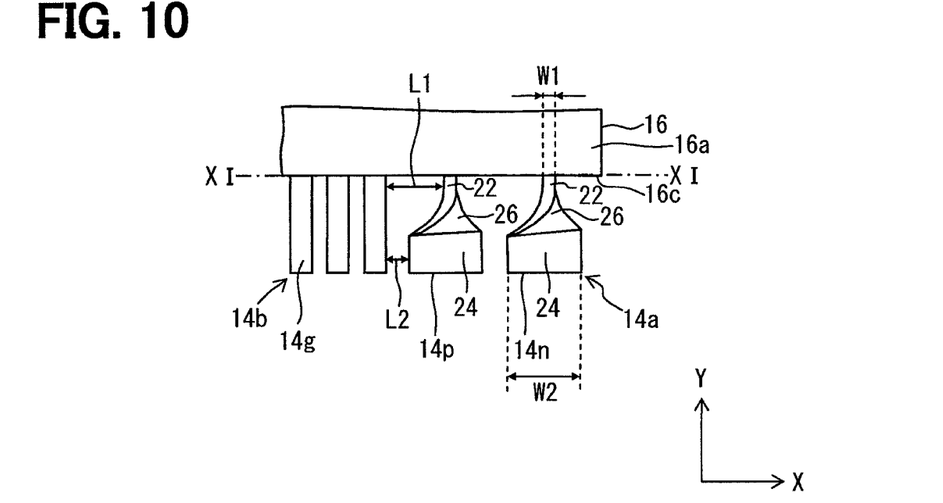
FIG. 10 is a diagram showing a plan view of the part of the semiconductor device shown by the dashed line IV in FIG. 2 according to the second embodiment of the present disclosure.
Figure 11:
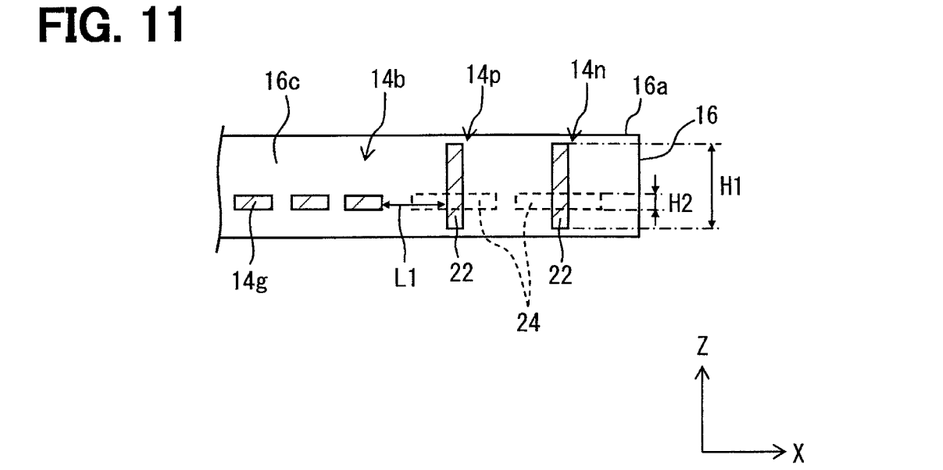
FIG. 11 is a diagram showing a cross-sectional view of the part of the semiconductor device in a line XI-XI in FIG. 10 according to the second embodiment of the present disclosure.

As shown in FIG. 9 to FIG. 11, among the main terminals 14a of the terminals 14 projected from the first side surface 16c, each of the P terminal 14p and the N terminal 14n has the twist portion 26. Further, none of the control terminals 14b having plate shapes has the twist portion 16.

As shown in FIG. 9, the twist portion 26 of each of the P terminal 14p and the N terminal 14n has two sub twist portions 26a, 26b. Each of the two sub twist portions 26a, 26b is arranged at two ends of the first portion 22 along the Y axis. In each of the P terminal 14p and the N terminal 14n, one sub twist portion 26a arranged outside of the resin portion 16 is referred to as a first sub twist portion 26a, and the other sub twist portion 26b arranged inside of the resin portion 16 is referred to as a second sub twist portion 26b. The first sub twist portion 26a connects the first portion 22 and the second portion 24, which are arranged outside of the resin portion 16. The second sub twist portion 26b connects the first portion 22 and the second portion 24, which are arranged inside of the resin portion 16.

The first sub twist portion 26a is twisted so that a direction along the thickness of the first portion 22 is angled at approximately 90 degrees with respect to a direction along a thickness of the second portion 24. Herein, the thickness of the second portion 24 is a length of the second portion 24 along the Z axis. The second sub twist portion 26b is twisted at an angle of 90 degrees in an opposite direction with respect to the first sub twist portion 26a, which is arranged outside of the resin portion 16. That is, the main terminal 14a is first twisted by the first sub twist portion 26a, and then, is twisted back by the second sub twist portion 26b. Thus, a direction along a thickness of each of the second portions 24, which are arranged inside and outside of the resin portion 16, is approximately parallel to the Z axis, and the direction along the thickness of the first portion 22 is approximately parallel to the X axis.

Further, each of the output terminals 14u, 14v, 14w projected from the second side surface 16d of the resin portion has a similar structure with each of the P terminal 14p and the N terminal 14n.

In the present embodiment, the main terminal 14a is formed by the bending process to have the shape shown in FIG. 9 to FIG. 11. As shown in FIG. 11, the length H1 of the first portion 22 is greater than the length H2 of the second portion 24 along the Z axis. Further, as shown in FIG. 10, the width W1 of the first portion 22 is smaller than the width W2 of the second portion 24. Thus, similar advantages provided by the semiconductor device 10 according to the first embodiment are provided by the semiconductor device 10 according to the present embodiment.

Further, in the present embodiment, the main terminal 14a has the twist portion 26 adjacent to the first portion 22 instead of bending the first portion 22 as disclosed in the first embodiment. Thus, a dimensional accuracy of the first portion 22 is improved, and an accuracy of the creeping distance is improved, accordingly.

In the present embodiment, the main terminal 14a, which provides the subject terminal, has the twist portion 26 including two sub twist portions 26a, 26b. Further, the number of the sub twist portions may be one, three or more. For example, in FIG. 9, the main terminal 14a may have the second sub twist portion 26b only without the first sub twist portion 26a. In this case, only the first portion 22 is arranged outside of the resin portion 16. In a structure that the main terminal has two sub twist portions 26a, 26b and the main terminal 14a is twisted by the first sub twist portion 26a and twisted back by the second sub twist portion 26b, the semiconductor chips 12 and other circuit components are easy to be connected with the terminal 14 compared with a structure in which only one twist portion 26 is formed in the terminal 14.

In the present embodiment, the twist portion 26 is twisted by an angle of 90 degrees. Further, the twist angle may be set other than 90 degrees under a condition that (i) the direction along the thickness of the first portion 22 is different from the direction along the thickness of the second portion 24, (ii) the length Hi of the first portion 22 is greater than the length H2 of the second portion 24 along the Z axis, and (iii) the width W1 of the first portion 22 is smaller than the width W2 of the second portion 24. Further, the direction along the thickness of the first portion 22 may be parallel to the X axis, or may be angled with respect to the X axis.

Further, at least one of the main terminals 14a may have the twist portion 26 instead of forming the twist portion 26 in all of the main terminals 14a.

Third Embodiment

The following will describe a semiconductor device 10 according to a third embodiment of the present disclosure. In the following description, description of the same or equivalent parts with the foregoing embodiments will be omitted.

In the present embodiment, the terminal 14 having the first portion 22 and the second portion 24 further has at least one slit 28 in addition to the structure of the semiconductor device 10 according to the first embodiment or the second embodiment. The slit 28 extends along the Y axis from a first point to a second point. The first point is positioned inside of the resin portion 16 between one inside end of the terminal 14 and the side surface 16c, 16d of the resin portion 16 from which the terminal 14 is projected. The second point is positioned outside of the resin portion 16, and is provided by an outside end of the terminal 14. The slit 28 divides an outside end portion of the terminal 14 into at least two legs, and each of the two legs has a bent portion, which is formed by a bending process. In the semiconductor device 10 according to the present embodiment, other parts are similar to the structure of the semiconductor device 10 according to the first embodiment.

Figure 12A:
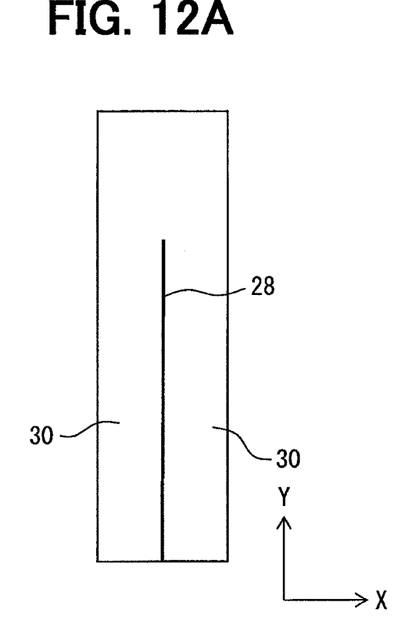
FIG. 12A is a diagram showing a plan view of a subject terminal of a semiconductor device according to a third embodiment before a bending process.
Figure 12B:
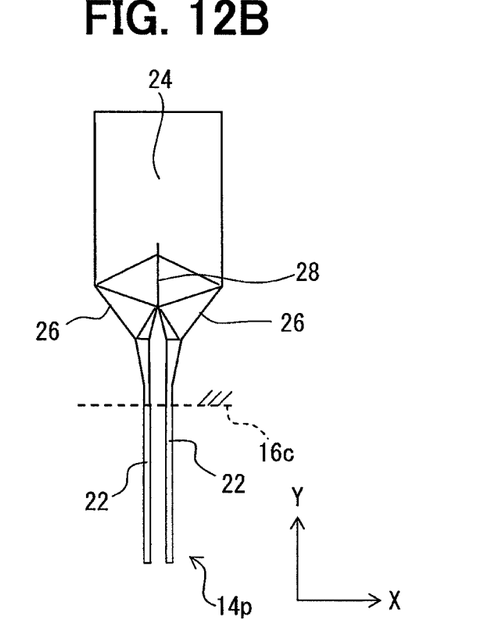
FIG. 12B is a diagram showing a plan view of the subject terminal of the semiconductor device according to the third embodiment after the bending process.

FIG. 12A shows the P terminal 14p before performing the bending process, and FIG. 12B shows the P terminal 14p after performing the bending process. As shown in FIG. 12A and FIG. 12B, the P terminal 14p has one slit 28 as an example. The slit 28 extends along the Y axis from the first point positioned inside of the resin portion 16 to the second point positioned outside of the resin portion 16. Further, each of two legs 30 divided by the slit 28 has the twist portion 26, which is arranged near a root of the slit 28 inside of the resin portion 16. That is, the twist portion 26 is adjacent to the second portion 24 that is arranged inside of the resin portion 16. In each of two legs 30 divided by the slit 28, a part arranged outside of the resin portion 16 provides the first portion 22. The P terminal 14p may be formed by the following manufacturing method. First, the slit 28 is formed on a metal plate having a rectangular plate shape on the X-Y plane. Then, each of the legs 30 divided by the slit 28 is bended or twisted. In FIG. 12B, the first side surface 16c is shown by a dashed line.

Further, each of the N terminal 14n and output terminals 14u, 14v, 14w has a similar structure with the P terminal 14p shown in FIG. 12A and FIG. 12B.

In the present embodiment, since the slit 28 is formed in the terminal 14, bending process or twisting of the terminal 14 is easy to be performed. Further, the width of the first portion 22 along the X axis is reduced and the length of the first portion along the Z axis is reduced. Thus, the body size of the semiconductor device 10 according to the present embodiment is reduced along the Z axis.

Further, at least one of the main terminals 14a may have the slit 28 instead of forming the slit 28 in all of the main terminals 14a.

In the present embodiment, the slit 28 extends from the first point to the second point, which is the outside end of the terminal 14 positioned outside of the resin portion 16. Further, the second point may be positioned between the outside end of the terminal 14 and the side surface 16c, 16d from which the terminal 14 is projected. That is, two second portions 24 may be arranged at two ends of the terminal 14 in the direction along the Y axis.

In the present embodiment, the terminal 14 having the twist portion 26 is described as an example. Further, the terminal 14 according to the present embodiment may have the first portion in which the two lateral ends are bent toward the first surface 16a of the resin portion as described in the first embodiment.

Fourth Embodiment

The following will describe a semiconductor device 10 according to a fourth embodiment of the present disclosure. In the following description, description of the same or equivalent parts with the first embodiment will be omitted.

Figure 13:
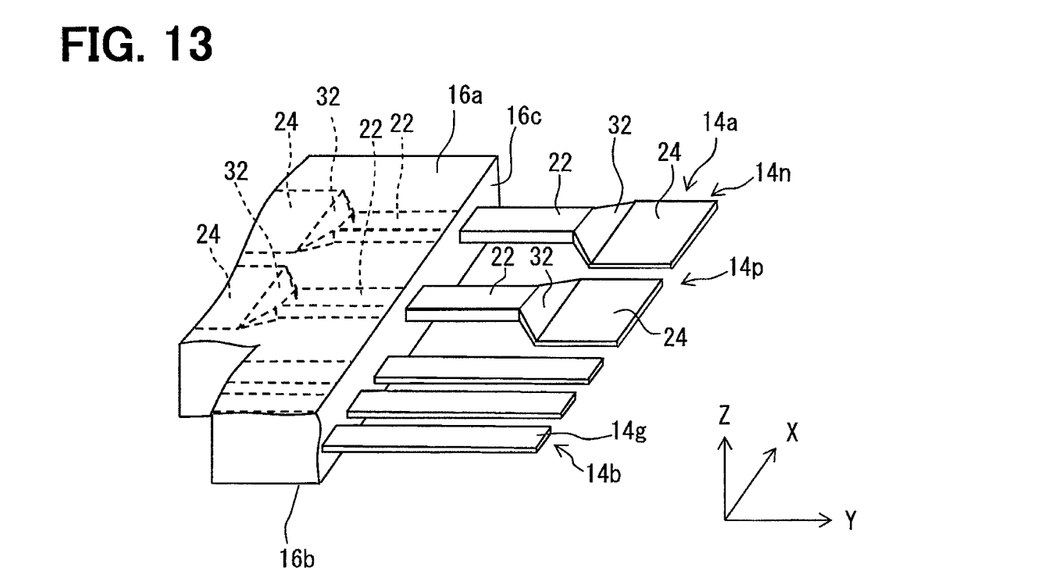
FIG. 13 is a diagram showing a perspective enlarged view of the part of the semiconductor device shown by the dashed line IV in FIG. 2 according to a fourth embodiment of the present disclosure.

In the present embodiment, the terminal 14 having the first portion 22 and the second portion 24 is provided by a deformed metal plate or a deformed metal bar. Other parts of the semiconductor device 10 according to the present embodiment are similar to the semiconductor device 10 according to the first embodiment.

As shown in FIG. 13, each of the P terminal 14p and the N terminal 14n projected from the first side surface 16c is provided by the deformed metal plate having different lengths along Z axis, and the deformed metal plate is punched to have a predetermined shape in order to provide the first portion 22 and the second portion 24 without performing the bending process. In each of the P terminal 14p and the N terminal 14n, the metal plate is punched so that the length H1 of the first portion 22 along the Z axis is greater than the length H2 of the second portion 24 along the Z axis, and the width W1 of the first portion 22 is smaller than the width W2 of the second portion 24 along the X axis. Further, as shown in FIG. 13, the terminal 14p, 14n has a connection portion 32 that connects the second portion 24 with the first portion 22. In a direction pointing the first portion 22 along the Y axis, a width of the connection portion 32 decreases and a length of the connection portion 32 along the Z axis increases so that the main terminal 14a has a constant cross-sectional area along the Y axis. That is, in a direction pointing the second portion 24 along the Y axis, the width of the connection portion 32 increases and the length of the connection portion 32 along the Z axis decreases so that the main terminal 14a has a constant cross-sectional area along the Y axis.

Further, each of the output terminals 14u, 14v, 14w projected from the second side surface 16d of the resin portion has a similar structure with each of the P terminal 14p and the N terminal 14n.

As described above, the main terminal 14a having the first portion 22 and the second portion 24 may be provided by a deformed member, such as the deformed metal plate or the deformed metal bar. Thus, the terminal 14a having the first portion 22, the second portion 24 and the connection portion 32 can be precisely and easily shaped without performing the bending process while securing the creeping distance.

Further, at least one of the main terminals 14a may be provided by the deformed member instead of providing all of the terminals 14a with the deformed members.

Figure 14:
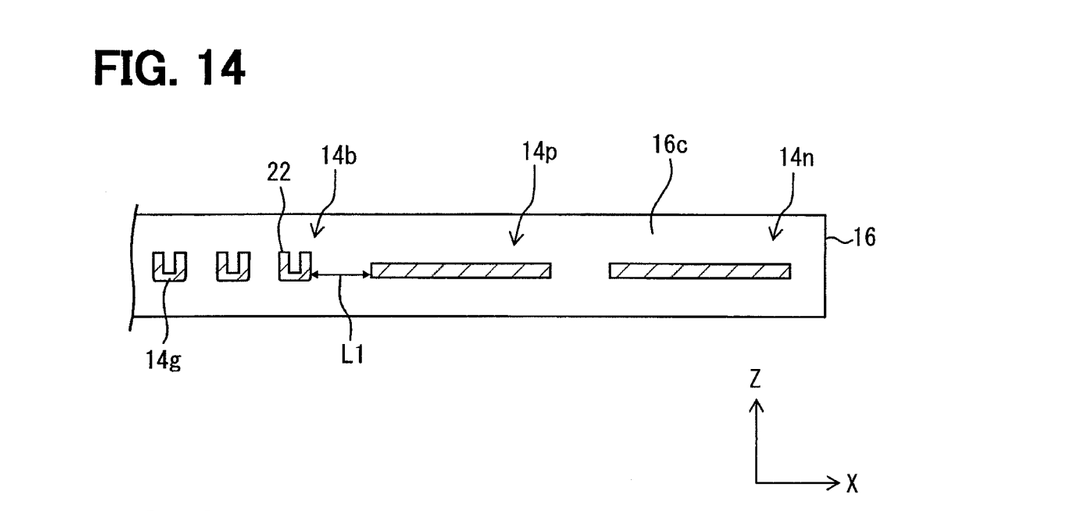
FIG. 14 is a diagram showing a cross-sectional view of a part of a semiconductor device according to a third modification of the present disclosure.
Figure 15:
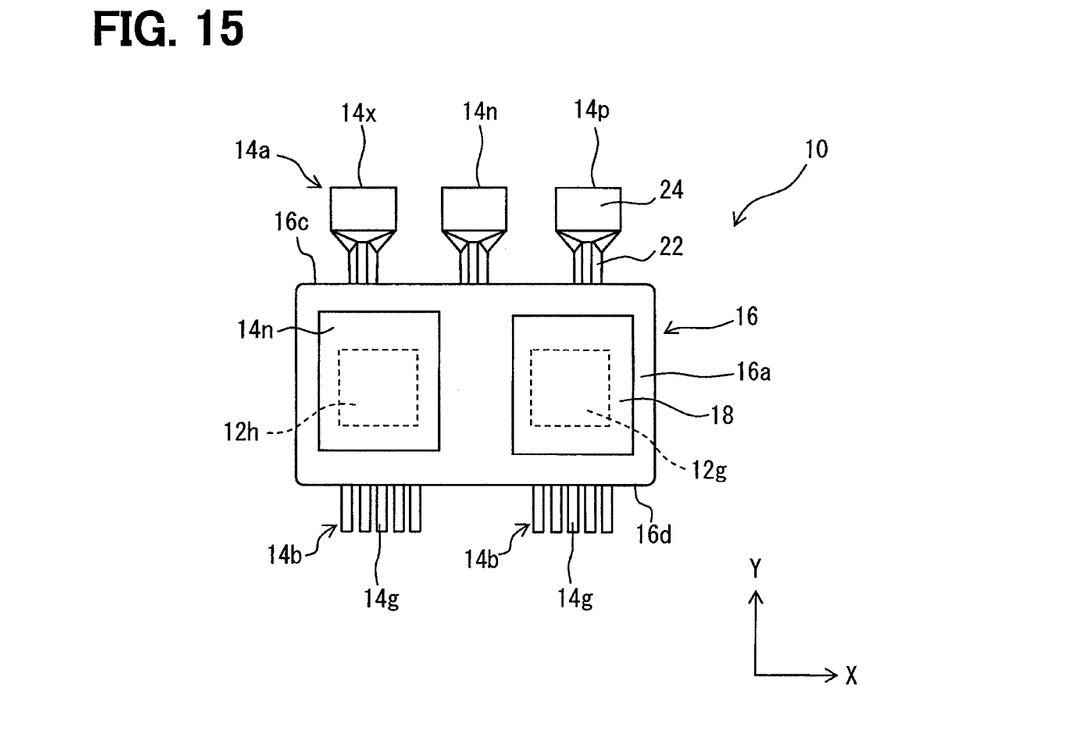
FIG. 15 is a diagram showing a plan view of a semiconductor device according to a fourth modification of the present disclosure.

The following will describe other embodiments of the present disclosure with reference to FIG. 14 and FIG. 15.

In the foregoing embodiments, the main terminal 14a has the first portion 22 and the second portion 24. Further, the control terminal 14b may have the first portion 22 and the second portion 24. FIG. 14 shows a third modification of a semiconductor device 10 according to the present disclosure. As shown in FIG. 14, neither the P terminal 14p nor the N terminal 14n has the first portion 22, while the control terminal 14b has the first portion 22 and the second portion 24.

In FIG. 14, all of the control terminals 14b have the first portions 22. Further, at least one of the control terminals 14b may have the first portion 22. Further, at least one of the main terminals 14a and at least one of the control terminals 14b may have the first portions 22. In FIG. 14, a part of the control terminal 14b is bent to provide the first portion 22. Further, a part of the control terminal 14b may be twisted to provide the first portion 22 and the twist portion 26 as described in the foregoing embodiments.

In the foregoing embodiments, the semiconductor device 10 has the 6 in 1 package. Further, a semiconductor device having a different package type may also have the above-described configurations. For example, as shown in FIG. 15, a semiconductor device 10 having a 2 in 1 package may also have the above-described configurations. Further, a semiconductor device having a 1 in 1 package may also have the above-described configurations.

As shown in FIG. 15, the semiconductor device 10 has two semiconductor chips 12g, 12h. The semiconductor device 10 has relay terminals 18, which electrically connect the output terminal 14x with the semiconductor chip 12g. The semiconductor chip 12g provides the upper arm circuit. The main terminals 14a including the output terminal 14x, the N terminal 14n, and the P terminal 14p are projected from the first side surface 16c of the resin portion 16. The output terminal 14x, the N terminal 14n, and the P terminal 14p are arranged in order along the X axis. Further, control terminals 14b of the semiconductor chips 12g, 12h are projected from the second side surface 16d of the resin portion 16 that is opposite to the first side surface 16c. All of the main terminals 14a including the output terminal 14x, the N terminal 14n, and the P terminal 14p have the first portions 22 and the second portions 24. In FIG. 15, the first portion 22 has the U-shaped cross section as an example similar to the first embodiment of the present disclosure. Further, the first portion 22 and the second portion may have a structure described in the foregoing embodiments.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A semiconductor device comprising:
    a semiconductor chip;
    a plurality of terminals electrically connected with the semiconductor chip; and
    a resin portion sealing the semiconductor chip and partially sealing each of the terminals,
    wherein the terminals are arranged in a first direction, and are projected from a side surface of the resin portion and extend outward from the side surface,
    wherein a longitudinal direction of each of the terminals is referred to as a second direction, and a direction perpendicular to the first direction and the second direction is referred to as a third direction,
    wherein the terminals include at least one subject terminal that has a first portion and a second portion,
    wherein, in the subject terminal, a first longitudinal end of the first portion is positioned inside of the resin portion and a second longitudinal end of the first portion is positioned outside of the resin portion, and the second portion is arranged adjacent to the first portion in the second direction, and
    wherein, in the subject terminal, a length of the first portion is greater than a length of the second portion in the third direction and a length of the first portion is smaller than a length of the second portion in the first direction.

2. The semiconductor device according to claim 1,
    wherein the semiconductor chip includes a power semiconductor element,
    wherein the terminals include a plurality of main terminals and a plurality of control terminals, and
    wherein the subject terminal is provided by one of the main terminals or the terminal adjacent to the one of the main terminals.

3. The semiconductor device according to claim 1,
wherein a part of the subject terminal is bent so that the first portion has the length greater than the length of the second portion in the third direction and has the length smaller than the length of the second portion in the first direction.

4. The semiconductor device according to claim 1,
wherein the subject terminal is provided by a deformed member having a first part providing the first portion and a second part providing the second portion, and
wherein the first part of the deformed member has a length greater than a length of the second part in the third direction, and the first part of the deformed member has a length smaller than a length of the second part in the first direction.

5. The semiconductor device according to claim 2,
wherein the subject terminal is provided by the one of the main terminals.

6. The semiconductor device according to claim 2,
wherein the terminal adjacent to the one of the main terminals is one of the control terminals, and
wherein the subject terminal is provided by the one of the control terminals adjacent to the one of the main terminals.

7. The semiconductor device according to claim 3,
wherein, in the subject terminal, the first portion is bent so that the length of the first portion is smaller than the length of the second portion in the first direction.

8. The semiconductor device according to claim 3,
wherein the first portion includes a bottom section and a bent section that is bent in the third direction with respect to the bottom section.

9. The semiconductor device according to claim 3,
wherein the subject terminal further includes a twist portion connected with the first portion, and
wherein a direction along a thickness of the first portion, which has a plate shape, is perpendicular to the second direction, and is parallel to or angled with the first direction.

10. The semiconductor device according to claim 3,
wherein the subject terminal has at least one slit extending in the second direction from a first point to a second point, the first point is positioned inside of the resin portion between an inside end of the subject terminal and the side surface, and the second point is positioned outside of the resin portion, and
wherein the slit divides an outside end portion of the subject terminal into at least two legs, and each of the at least two legs has a bent portion.

\* \* \* \* \*